United States Patent [19]

de Lima et al.

[11] Patent Number: 5,497,406

[45] Date of Patent: Mar. 5, 1996

[54] MULTI-STANDARD GENERATOR OF PERIODIC SIGNALS

[75] Inventors: Jader A. de Lima, Meylan; Yong-Uk Lee; Pierre J. Nunzi, both of Aix En Provence, all of France

[73] Assignee: SGS-Thomson Microelectronics S.A., Saint-Genis, France

[21] Appl. No.: 314,661

[22] Filed: Sep. 29, 1994

[30] Foreign Application Priority Data

Sep. 29, 1993 [FR] France .................................. 93 11563

[51] Int. Cl.⁶ .............................. G06F 9/00; H03K 21/14; H03K 3/64
[52] U.S. Cl. .................................. 377/44; 377/26; 377/52
[58] Field of Search ................................ 377/44, 52, 26

[56] References Cited

U.S. PATENT DOCUMENTS

| | | | |
|---|---|---|---|
| 3,758,825 | 9/1973 | Kapers | 315/370 |
| 4,408,337 | 10/1983 | Cang | 377/44 |
| 4,499,589 | 2/1985 | Geesen | 377/44 |
| 4,631,484 | 12/1986 | Malka et al. | 377/44 |
| 5,142,651 | 8/1992 | Cronyn | 377/26 |

FOREIGN PATENT DOCUMENTS

| | | | |
|---|---|---|---|
| 0052032 | 5/1982 | European Pat. Off. | H04N 3/16 |
| 1353147 | 5/1974 | United Kingdom | H04N 3/16 |
| 2076571 | 12/1981 | United Kingdom | H03L 3/64 |
| 2101459 | 1/1983 | United Kingdom | H04N 3/22 |

OTHER PUBLICATIONS

Instruments and Experimental Techniques, vol. 29, No. 5, 1, Sep. 1986, New York, US pp. 1101–1102 by Golovanov et al "Analog–Digital Generator of Periodic Signals of Arbitrary Shape".

O. Limann et al.: "Fernsehtechnik Ohne Ballast"; 1991, Franzis edition, Munich, Germany, pp. 498–523.

U. Tietze & Ch. Schenk: "Halbleiter–Schaltungstechnik" 1983, Springer Verlag, Berlin, Heidelberg, New York, Tokyo; pp. 250–251.

*Primary Examiner*—John S. Heyman
*Attorney, Agent, or Firm*—David M. Driscoll; James H. Morris

[57] ABSTRACT

A periodic signal is produced by counting pulses of a clock during a given period of time. The number of pulses counted is divided by a whole number. A count is then made of a batch of pulses of this clock, the number of pulses in this batch corresponds to the quotient of this division. At each time a batch is completed, a value of a periodic signal is produced.

16 Claims, 3 Drawing Sheets

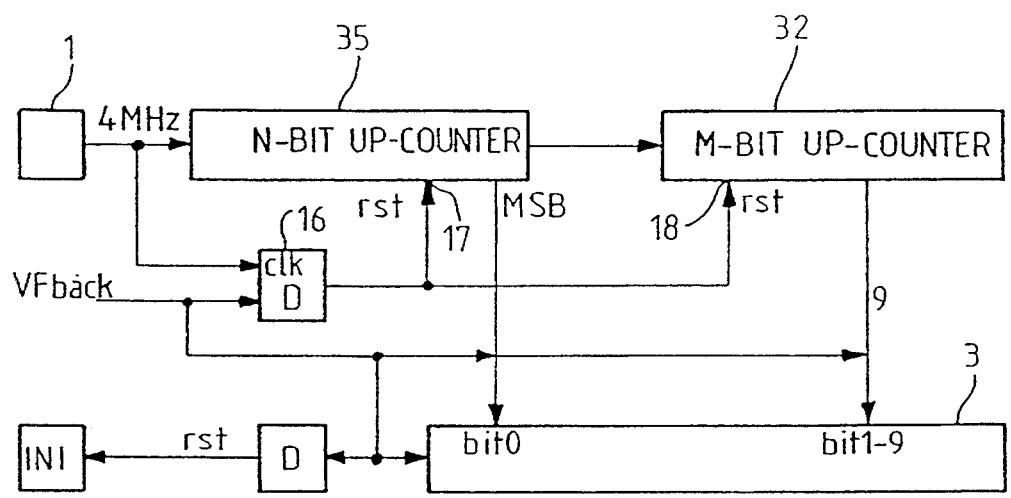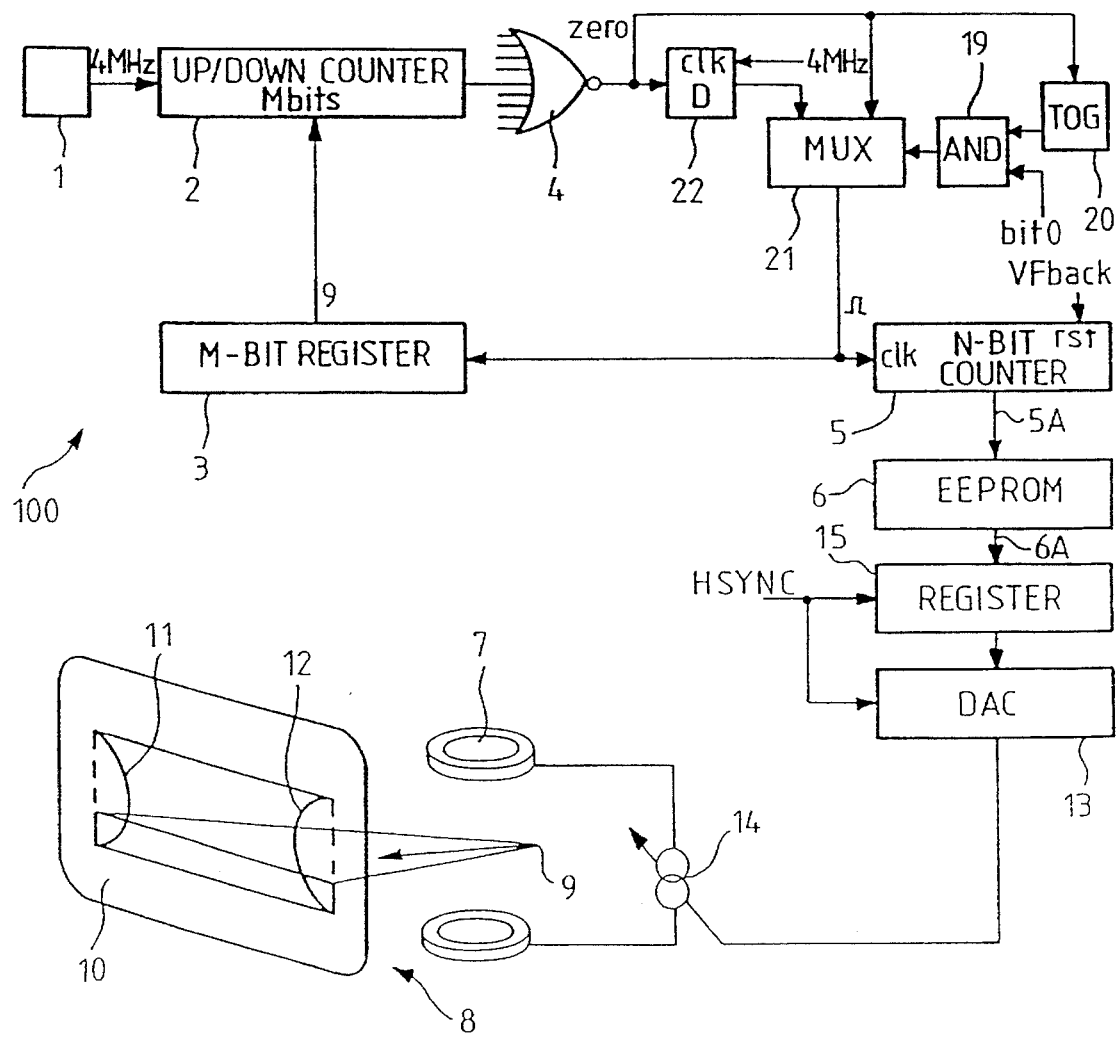
FIG_2

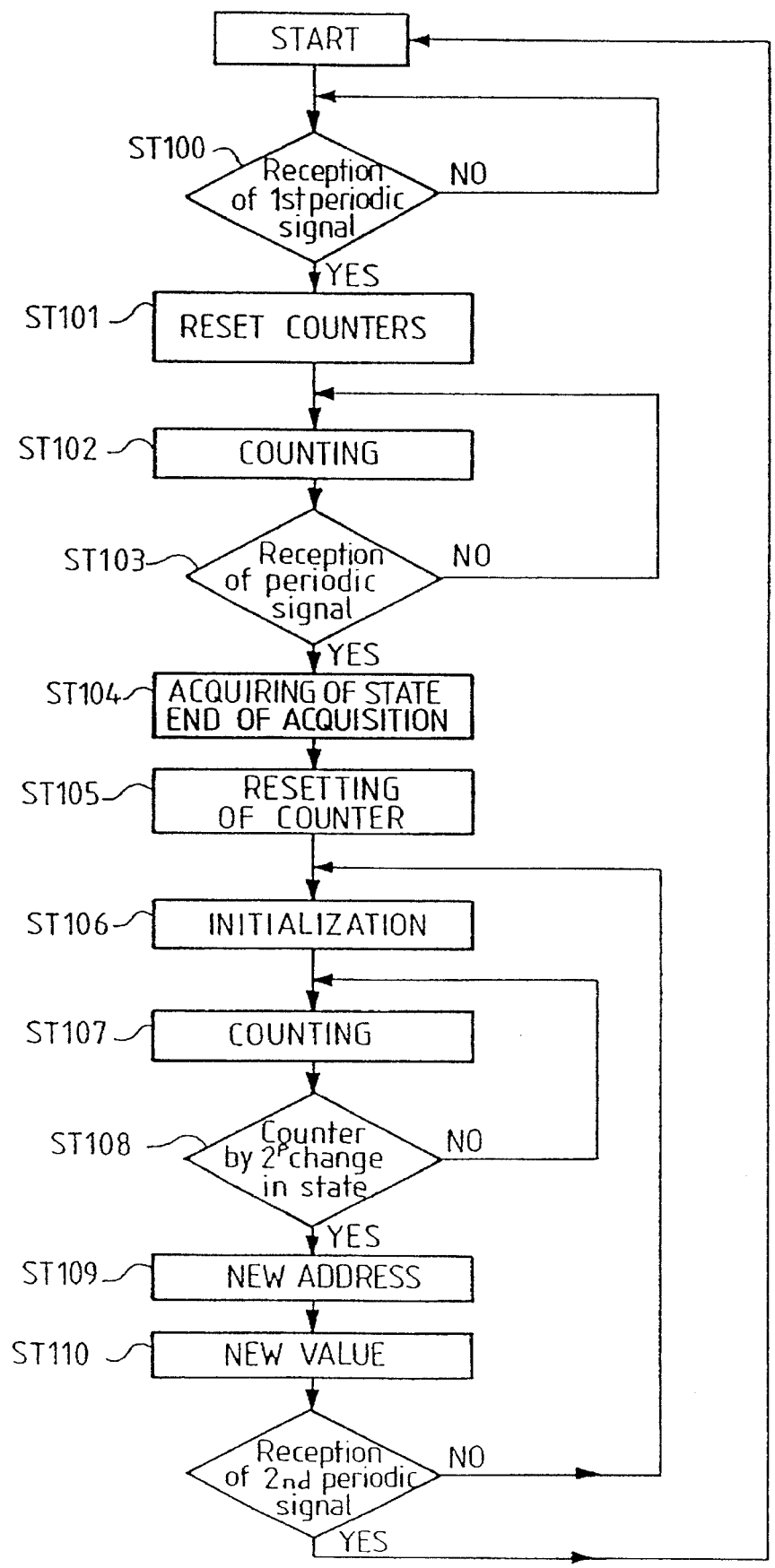

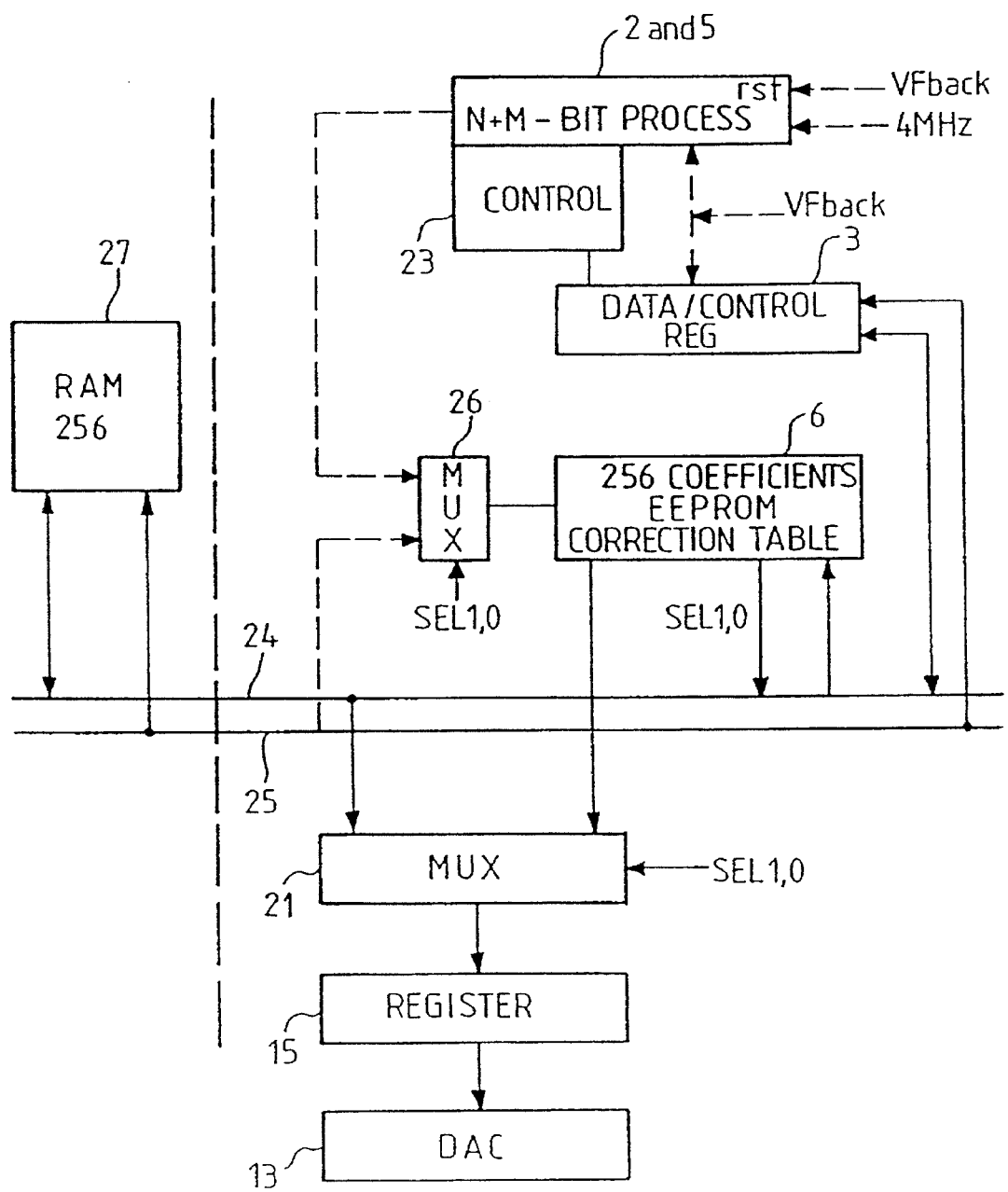
FIG_4

MULTI-STANDARD GENERATOR OF PERIODIC SIGNALS

BACKGROUND OF THE INVENTION

1. Field of the Invention

The present invention relates to a generator of periodic signals having any period and a given shape. The generator may be applied to any field, including the field of television.

2. Discussion of the Related Art

The related art and the invention shall be described in the context of the processing of television signals to facilitate the description. However, the principles of the invention have broader application and the description should not in any way limit the scope of the invention.

Horizontal scanning signals as well as vertical scanning signals are known in the field of television signals and are used to display images on cathode-ray tube screens. The horizontal scanning signal is a signal applied to deflection coils or electrodes of one or more electron guns sending out electrons from a cathode to an electroluminescent screen. To display and image, the screen is scanned in order to display a certain number of lines in vertical relation to one another from the top to the bottom of the screen.

The number of lines displayed on a television screen varies according to the resolution desired, as well as according to the display standards used in the different regions of the world. While 420-line or 625-line images are currently known, new standards stipulate 1024 lines and even 2048 lines. Furthermore, the frequency of refreshing of the images on the screen, which is currently 25 images per second, also depends on the qualities and standards desired. For example, a rate of 50 images per second is envisaged to prevent the effects of scintillation.

These different standards and different requirements currently require scanning signal generators that are specific to each of the uses.

Furthermore, a cathode-ray tube screen depicts the image in distorted form because of so-called "pincushion distortion." For horizontal scanning, pincushion distortion refers to the effect wherein the length scanned by the trace of the electron gun on the screen, namely the spot, depends on the altitude of the line to be scanned. In practice, the length traveled by the spot for the lower and upper lines is greater than it is for the median lines. The variation is actually continuous so that, at its left-hand and right-hand edges, the image has parabola-shaped profiles.

This phenomenon is due to the application and to the deflection devices of the electron guns. This phenomenon is already known.

Attempts have been made to correct this problem by applying additional voltage or current to these deflection devices as a function of the line to be corrected so that the field of exploration is always the same, whatever the altitude of the line. For example, a circuit known as "TDA 815"by S.G.S. THOMSON MICROELECTRONICS, is capable of producing such correction signals. The implementation of a circuit of this type necessitates, however, prior setting, first as a function of the standard according to which the monitor will work and, second, as a function of deterioration of the particular display monitor. This results in a generation of instruments in which the mode of use and the standards must be planned in advance.

SUMMARY OF THE INVENTION

Thus an object of the invention is to be free of such constraints, resulting from this preliminary knowledge and to have the ability to adapt, even in the future, to any standard that might appear. The problem to be resolved in the present case, therefore, is the following: given the knowledge of the curve of pincushion distortion of a display monitor, a correction signal must be produced that changes in time between a starting value and a final value, during a chosen period, while there is no a priori knowledge of the duration of this chosen period. This is notably the case when the standard will change from 25 images per second to 50 or 40 images per second.

The goal is to produce a system by which time can be expanded or contracted. Until now, only analog circuits have made it possible to obtain such results. Furthermore, these circuits are limited solely to the production of very simple signals which are typically sinusoidal. It suffices, in these analog circuits, to modify a reactive parameter, such as an adjustable capacitor or adjustable inductor, to obtain the desired result.

In contrast, the invention seeks to modify signals of any shape, including signals that are not necessarily sinusoidal. This aim is attained by counting, during the chosen period to be complied with, the pulses of a clock that is fast enough to produce many pulses during this period. After this counting operation, there is obtained a number A of pulses relating the frequency of this clock to the duration of this period. This number of pulses is then divided by a whole number 2 N to obtain a number P of pulses corresponding to the numerator of a fraction of the total number of pulses. Pulses produced by this clock are then counted to produce batches or packets of pulses in such a way that the number P of these pulses in these batches corresponds exactly to the numerator of this fraction. Whenever a batch has been completely counted, a reading is prompted, in a random-access memory, of a value whose address corresponds to a rank of the batch in the period. The value that is read of this memory may be any value, but, corresponding to the rank of a batch that is regularly retrieved, it will be re-read periodically along with the preceding and following values at preceding and following addresses in this memory. In practice, the rank is physically indicated by the state of a counter that counts the number of batches of counted pulses. A succession of values such as this, read in the memory, reconstitutes the periodic signal sought.

An object of the invention therefore is a generator of periodic signals that have any period but have a given shape. The generator includes the following:

a clock delivering a number A of pulses during a period chosen for these periodic signals, A being smaller than or equal to $2^{N+M}$, N and M being whole numbers;

a first binary digital counter with M bits, $2^M$ being greater than or equal to a whole number P, receiving the pulses of the clock at its counting input, provided with a mechanism to count the batches of P pulses of the clock that occur during $1/(2^N)$ fractions of said chosen period, and delivering a batch signal at each counting of a batch;

a cyclical second binary digital N-bit counter receiving said batch signal at its input, and producing an address signal at each counting of a batch signal;

a memory with at least $2^N$ random-access addresses provided with an address input and a data output, connected by its address input to the output of the second counter and delivering, at its output, binary signals corresponding to the address signals produced; and a converter circuit connected to the output of the memory to produce said periodic signal as a function of the binary signals received.

In the television field, the generator will be used preferably for the correction of a horizontal scan. The invention will be described with reference to the production of a digital signal, which is put into an analog form after a processing operation. However the principles of the invention also apply, if the signal were an analog signal. The invention also relates to the use of a method that conforms to the one described here below.

BRIEF DESCRIPTION OF THE DRAWINGS

The invention will be understood more clearly from the following description and from the figures that accompany it. These figures are given purely by way of an example and in no way restrict the scope of the invention.

FIG. 1 shows a circuit used to count pulses produced by a clock during a chosen period. This circuit also includes a mechanism to divide the number of counted pulses to produce a reduced number of pulses corresponding to those occurring in a batch of pulses.

FIG. 2 shows a circuit for implementing the invention in a use designed to correct the pincushion deformation of a television monitor.

FIG. 3 is a flowchart of actions carried out by a control circuit to control the circuits of FIGS. 1 and 2.

FIG. 4 shows a schematic view of a microprocessor that can be used to implement the invention.

DETAILED DESCRIPTION

FIG. 2 shows a generator 100 of periodic signals having any period but having a given shape according to the invention. This circuit has a clock 1 delivering a large number of pulses during a period chosen for the periodic signals. For example, in an application to correct the pincushion distortion of a display monitor, the frame scanning periodic signal is in the range of 25 milliseconds (for 40 images per second). By choosing a clock 1 that oscillates at 4 MHz, it is possible to obtain up to 100,000 pulses per frame. To facilitate the description, a frame will be considered as equivalent to an image and hence to two half-frames. The generator includes a first binary digital counter 2 with M cascade-connected cells. In one example, M is equal to 9. The counter 2 is a binary counter counting in natural binary counting mode. However, it could also be a bit-by-bit or other type of counter. The counter 2 has M outputs delivering binary signals that represent the state of the M cells of this counter. The counter 2 is, in practice, a countdown device or down-counter that is pre-loaded before the countdown operation by the contents of a register 3 (with the same number of bits). Once the counter 2 has been pre-loaded, it counts down at the rate of the pulses of the clock 1 until it reaches a state zero. The contents of the counter is initially loaded to a value P, P being lower than or equal to $2^M$.

In one example, the state zero may be detected by the presence of a NOR type gate 4 with M inputs connected to M outputs or counter states. The output of this gate 4 goes temporarily to the state 1 when the M outputs of the counter 2 are all zero. The output of the gate 4 is itself used to activate the loading of the counter 2 with the contents of the register.

As such, a countdown operation to zero corresponds to "a batch" of clock pulses equal to the value loaded into the register 3. Afterwards, a subsequent countdown operation is resumed. Consequently, the NOR gate 4 delivers a pulse as soon as a batch is counted. This batch-counting pulse is then transmitted to a second counter 5 which is a counter, having N cells. In one example, N is equal to 8. The counter 5 counts in natural binary counting mode. Whenever the counter 5 receives a pulse, it delivers an N-bit counting word 5A which is used as an address. This counting word is applied to an address input of a random-access memory 6, which may be an EEPROM. When addressed in this way, the memory 6 delivers a binary word 6A. The binary signal from the memory is used to control horizontal deflection magnetic coils 7 of a cathode-ray tube type monitor 8. The coils 7 cause the horizontal scanning.

When these coils 7 are supplied with a constant current, as is the case in the prior art, they prompt a scan for a given duration. The length of this scan, however, depends on the altitude, on the screen, of the line that is scanned. This can be explained by the fact that the deflection is equivalent to a scanning angle. Since the cathode 9 of the CRT screen 8 is very close to the screen 10 itself, there is a path between this screen 10 and the cathode 9 that is notably longer for the lowest and highest lines of the screen than it is for the median lines. Consequently, because the path traveled is greater, the deflection of the spot is greater. The result of this phenomenon is that the length of the scanned lines is a function of the height of the line on the screen which substantially corresponds to the exemplary contours designated by the parabola arcs 11 and 12 on the screen 10.

In the invention it has been observed that this type of defect is essentially due to the geometry of the screen itself (the distance between the screen 10 and the cathode 9). It is not related to the mode of scanning, i.e., whether 400 or 625 lines per image are displayed or even whether 25 or 50 images per second are displayed.

The signal that is prepared at the output of the memory 6 by a digital-analog converter 13 is, in practice, added to the usual scanning signal applied to the coils 7. This type of addition is of a known type. It is represented schematically by a current supply 14 for the coils 7 whose intensity produced depends on the value of the signal delivered by digital-analog converter 13. Given that, for the central lines, the normally scanned distance is smaller than the useful distance, the current that should be applied to the coils 7 should receive additional intensity. In fact, another correction circuit must also be planned: this is the correction circuit whose operation consists in shifting the starting point of the scanning operation to one side, the side at which the line starts scanning. These effects shall not be further described here except to the extent that they are material to the present invention, which produces the periodic signal itself. Suffice it to say, the signals that exist in the device 8 are capable of carrying out the appropriate corrections once they are supplied with the right correction signals.

In the invention, therefore, an a priori unknown period will be measured: this period is the one corresponding to a received video signal frame. This measurement will then be taken into account to correct the scanning signals in a periodic signal having the period thus measured.

In the invention, it has been furthermore decided to distribute the correction to be applied to the screen discretely, in a reduced number of steps. This number of steps is preferably chosen to be smaller than the minimum number of lines that the television monitor is likely to show. Since 400 lines is now the minimum, a 256-step correction has been chosen. In other words, for a given period of scanning of a frame, the period, i.e., the unknown period which is measured, is divided into 256 elementary sub-periods. For each of these sub-periods, which are naturally ordered in time with respect to one another, it is possible to have a corresponding line or group of horizontal scanning lines juxtaposed with one another on the screen 10. Consequently this line, or these lines, must receive one and the same correction. This is the aim of the signal produced by the memory 6. Whenever a line or group of lines is changed, the counter 5 changes its contents. The cycle is repeated each period.

There is a direct relationship between the particular choice of N=8 and the number 256 of sub-periods. Indeed $2^8=256$.

To this end, the output of the memory 6 is not directly connected to the digital/analog converter 13 but is connected to a register 15 that, throughout the duration of a sub-period corresponding to a line or group of lines, stores a correction value. Under these conditions, a horizontal synchronization signal HSYNC is applied to the register 15 to cause the register to sample a value from the memory which, must then be converted by the converter 13. The signal HSYNC is also applied to the converter 13 in order to trigger the conversion of this signal. Whenever the scanning reaches the start of a line, the register 15 is read. As soon as a group of lines has been displayed on the screen 10, the counter 2 produces a bit that causes the counter 5 to change its state by the counting of this bit. The memory 6 is addressed at this new address, and the register 15 is loaded with a new value. Thus, at the start of the next line, the contents of the register 15 are no longer the same. The converter 13 then converts the new value.

In this way, a staircase-shaped profile may be obtained to compensate for the effects of the contours 11 and 12 by proper programming of values into memory 6. Should N=8 and should there be 400 lines to be displayed, the groups of lines will not all be identical. They will sometimes comprise two lines and, sometimes, only one line. The periodic signal produced by the memory 6 evolves naturally according to the period referred to. The matching to the number of display lines is done automatically by picking up the contents of the register 15 from the signal HSYNC.

The circuit of FIG. 2 is the circuit implementing the generator of periodic signals of the invention.

The way in which the contents of the register 3 are acquired shall now be shown with reference to FIG. 1. The counter 35 is upline with respect to the counter 32. Counter 35 receives the signal of the clock 1, and whenever its most significant bit changes its state, it causes counter 32 to count. At the end of the counting, the counter 3 is loaded with a number of times that the counter 35 has made rotations. In practice, since the counter 35 is an eight-bit counter, it counts 256 pulses per rotation. At the end of the measurement, the counter 32 stores this number of pulses needed per batch to have 256 batches in the given period. To limit the operation to the counting of what happens in one and the same period, a D flip-flop 16 is used to activate resetting inputs 17 and 18 of the counters 35 and 32. The flip-flop 16 first receives the signal of the clock 1 and, second, an end-of-frame signal VFback. Whenever a full image has been seen, the D flip-flop 16 receives the signal VFback and changes its state in a pulsed way. It is possible, under these conditions, to reset the counter 35 and the counter 32. Furthermore, the end-of-frame signal VFback is used to load the contents of register 3 with the state of the counter 32 when this frame return occurs. Since the counter 32 is a 9-bit counter, the register 3 is a register with at least nine flip-flops to record the contents of the bits 1 to 9 of the counter 32.

In another embodiment, a higher degree of precision may be obtained for the measurement of the duration of the period. Indeed, it is possible that the a priori unknown period will not correspond to an exact number of batches of 256 pulses of the four MHz clock 1. Notably it is possible that, in the worst case, an error of 128 pulses may be made because this duration has corresponded to a whole number multiplied by 256 pulses, plus 256 pulses. That is, counter 35 may be one 4 MHz clock pulse away from counting another rotation and causing counter 35 to "carry out" and thus cause counter 32 to count. If the numbers are to be accurate to the nearest one half, then the counter may be off by up to 128 pulses. In particular, if the counter 35 contained values from 128 to 255, rounding to the nearest half would result in counter 32 having a next higher count. In order to take account of the partially counted state of the counter 35 before it is reset, the contents of the most significant bit of the counter 5 are loaded into an additional flip-flop of the register 3 at the time of the frame return. This flip-flop is called a zero bit flip-flop. The state of this zero bit is used as an input of an AND gate 19 (FIG. 2), the output of which is used to validate the transmission of a command prepared by a flip-flop circuit 20. Thus, in this case, batches are counted which are no longer always batches of P pulses but, on the contrary, sometimes batches of P pulses and sometimes batches of P+1 pulses. To do this, once in every two instances, the change in the state of the counter 5 is triggered one pulse later than at the end of the duration that finishes at the counting of P pulses (P being the binary content contained in the M (M=9) bit register 3. In this case, instead of P being counted, P+1 is counted. Thus, 128 times out of the 256 times possible, one more bit will be counted. Under these conditions, the reloading of the counter 2 with the contents of the register 3 is done at the time of the transmission to the counter 5 of the signal delivered by a multiplexer 21.

In this way, a correction is carried out in such a way that there is no shift or distortion in the correction itself. If this type of correction were not made, there would be a shift which would not be really inconvenient but would nevertheless exist in the parabolic correction.

To this end, the flip-flop toggle circuit 20 is a bistable type circuit, and it receives the signal delivered by the gate 4. It changes its state once in every instance that zero is detected by gate 4. If, further, the most significant bit of the counter 35 is at 1 at the time of the acquisition, i.e., bit 0 equals 1, the AND gate 19 then changes its state once in every instance. The AND gate 19 controls a multiplexer 21 which receives, as data inputs, the signal coming from the gate 4, and a delayed version thereof transmitted by a D type flip-flop 22. The D type flip-flop also receives the clock signal at 4 MHz. The D type flip-flop 22 also receives, at its input, the signal coming from the gate 4. The D type flip-flop 22 sends the signal available at the gate 4 to its output after having received a pulse of the clock at its clock input. Thus, when flip-flop 22 is selected by mux 21, this is equivalent to counting an additional clock pulse because D flip-flop 22 delays the transmission of the counting of the $2^m$ addresses.

The gate 19 therefore controls the multiplexer 21 to transmit either the signal coming from the gate 4 to the counter 5 or the signal coming from the D flip-flop 22. If the most significant bit of the counter 5 at the time of the acquisition (FIG. 1) is not at 1 but at 0, the gate 19 delivers 0 permanently at output. In this case, the multiplexer 21 permanently connects the output of the gate 4 directly to the input of the counter 5.

Preferably, the counter 5 is itself reset at zero when the frame is changed by receiving the signal VFback at its reset input.

In yet another embodiment, counter 5 and 35 and counter 2 and 32 are one and the same to save on counter cells. Unshown switches and muxes are used to reconnect the counters into the arrangements shown in FIGS. 1 and 2.

FIG. 3 shows a flowchart pertaining to the use of the invention. Initially, during a first stage, the contents of the register 3 measured by the counter 32 will be acquired. The duration of this first stage corresponds, for example, to a frame. Consequently, the reception of a period signal is awaited ST 100. In the present example, this signal is a frame signal: VFback. When it is received, the counters are reset by means of the flip-flop 16 ST 101. Then, the counting is activated for as long as the period signal is not received a second time ST 102 and 103. In doing so, the counter 35 progresses, counts batches of $2^N=2^8=256$ clock pulses and increments the contents of the counter 32 so that this counter counts a number of pulses that it needs per batch to have a total of 256 batches in the period. When the period signal (in this case the signal VFback) is received again, the state of the counter 32 is acquired in the register 3 by the application of this period signal ST 104. The zero bit is also acquired.

This terminates the phase of the measurement of the period. It is observed that this measurement phase is particularly useful if, in changing from a TV program that is broadcast according to a given standard, a user reaches a program that is broadcast according to another standard, i.e., another method, whose fineness varies, of showing the images. In each instance, the useful time needed for knowing the characteristics of the image is an image period. This is not perceptible and is quite acceptable to the user. That is, the user will not mind an image worth of data being distorted.

Once the state of the counter 32 has been acquired, the counters are reset, ST 105 at which time, the connections of the counters are reorganized according to FIG. 2 for the embodiment that uses the switches and muxes described above. In practice, as shall be seen below, the system may be implemented as a microprocessor-based system. The reversible counter or up/down counter 2 is initialized by the injection, into it, of the contents of the register 3 ST 106. Then the countdown is carried out ST 107. As soon as a countdown of P clock pulses is obtained ST 108, the state of the counter 5 is made to change ST 109. This change in state leads to a new value extracted from the memory 6 loaded into the register 15 ST 110. The register 15 is read at the rate of the signal HSYNC, namely at the rate of the scanning of the lines. This is reproduced as long as an end-of-period signal has not been received again.

When an end-of-period signal is received, there is a return to the initialization. This means that, at this point in time, the loading of the counter 2 with the contents of the register 3 is recommenced and so on and so forth. It is nevertheless possible to proceed in two ways. Either $2^N$ different changes in state are counted in order to start a new cycle of $2^N$ states, or else it is rather the end-of-period signal VFback that is relied upon to achieve resynchronization. In any case, the counter 2 is reinitialized with the contents of the register 3 at the start of the period.

FIG. 4 shows a diagram of an implementation of the invention with a microprocessor-based circuit and with a bus. In this diagram, the two counters 5 and 2 are constituted into a single counter with N+M bits=17 bits in the example. This counter receives commands through a processor 23 which also commands the control and data register 3. The counter receives the 4 MHz signal of the clock and the frame signal VFback, namely the period signal. The circuit also has a data bus 24, an address bus 25 and an input/output multiplexer 26. The input/output multiplexer enables the loading, into the memory 6 of a circuit attached to a monitor 8, of the correction coefficients measured on this monitor and stored beforehand in a member 27 connected to the bus 24 and 25. The multiplexer 26 also enables the memory 6 to be managed through the microprocessor. The reorganization of the connection of the counters is carried out by the microprocessor 23 with the following principle. Each connection of the elements of FIGS. 1 and 2 is connected to the other elements by a circuit comprising an AND gate. This AND gate receives the signal to be transmitted as well as a control signal that is active or inactive. It transmits the signal to be transmitted only in the former case. With this control signal which is active during the measurement phase and inactive during the using phase, it is easy to carry out the switch-over operation. For example, whenever channels are switched, the control signal will be active solely during the first frame. It is possible, in other applications, to conceive of a setting input to apply this control signal as desired.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is limited only as defined in the following claims and the equivalents thereto.

What is claimed is:

1. A generator of a periodic signal, comprising:
   a clock delivering a number A of pulses during a period defined by a control signal, A being smaller than or equal to $2^{N+M}$, N and M being whole numbers,
   a first programmable binary M-bit counter, $2^M$ being greater than or equal to a whole number P, receiving the pulses of the clock at a counting input, the first counter having means for counting batches of P pulses of the clock and for delivering a batch signal at each counting of a batch,
   a second binary N-bit counter receiving said batch signal at a counting input, and having means for producing an address signal at each counting of said batch signal,
   a memory with at least $2^N$ addresses provided with an address input and data output, receiving the address signal at the address input and providing as an output binary signals stored at a memory location corresponding to the address signal produced,
   a converter circuit connected to the output of the memory to produce said periodic signal, and
   a circuit to produce the whole number P, where P is equal to $A/2^N$ and to program the first programmable binary M-bit counter with the whole number P as a given state.

2. The generator according to claim 1, wherein the converter circuit comprises a transfer register that is connected by its input to the output of the memory and is provided with a transfer control input.

3. The generator according to claim 1 wherein the second counter has a resetting input activated by a signal at the period.

4. The generator according to claim 1 wherein the mans for determining and programming comprise a presetting register to preset the first counter in the given state at the start of the counting of the pulses of a batch, and the counting means further comprise a comparison circuit to make a comparison, at any time, of a state of the counter with the given state.

5. The generator according to claim 4, wherein the first programmable binary M-bit counter ms a down counter and wherein the comparison circuit has an OR or NOR gate with M inputs.

6. The generator according to claim 4 further comprising a logic circuit to connect the first and second counters and the presetting register differently.

7. The generator according to claim 6 wherein the logic circuit connects:

the second binary N-bit counter to receive the clock signal at its counting input;

and connects the first programmable binary M-bit counter to receive, at its counting input, counting pulses from the last stage of the second counter; and such that the two counters are connected to a presetting register to load the presetting register with a presetting signal corresponding to the contents P of the first counter and a part of the second counter, the presetting register comprising a control input activated by a signal at the period.

8. A generator of a periodic signal, comprising:

a clock generating clock pulses;

a loadable counter for counting responsively to the clock pulses;

means for determining a first value as a function of a first control signal;

means for loading the loadable counter with the first value;

means for detecting when the loadable counter has counted a number of clock pulses equal to the first value and for providing an output in response thereto;

a second counter for counting responsively to the output of the means for detecting and outputting a count output; and a memory, stored with pre-loaded values, receiving the count output of the second counter as an address and providing the periodic signal as an output of the memory.

9. The generator of claim 8 wherein the means for determining the first value includes means for counting a number of clock pulses that occur during a period defined by the first control signal, and the loading means includes a first plurality of most significant bits of a number defining the first value, wherein the first plurality being equal to a number of bits of the loadable counter.

10. The generator of claim 9 wherein the means for counting utilizes the second counter to count clock pulses and the loadable counter to count overflows of the second counter, the loadable counter providing a count value to a load register of the means for loading.

11. The generator of claim 10 wherein the means for detecting utilizes a most significant bit of the second counter such that, when the second counter is counting clock pulses and the most significant bit of the second counter is one, the means for detecting will prevent the second counter from counting responsively to the means for detecting every other time that the means for detecting detects that the loadable counter has counted a number of clock pulses equal to the first value.

12. A generator of period signals, comprising:

a clock;

an M-bit loadable counter;

an N-bit counter;

a load register, connected to the M-bit register;

means for detecting when the M-bit counter has counted a number of times equal to a value stored in the load register;

a connection network having two modes, wherein in a first mode, the connection network connects the N-bit counter to the clock to count clock pulses and connects the M-bit counter to an overflow of the N-bit counter, the M-bit counter loading its count value into the load register in response to a first control signal that defines a period, and wherein in a second mode, the M-bit register is connected to be loaded with the value of the load register, an output of the M-bit register is connected to the means for detecting, and the M-bit register is connected to count in response to the means for detecting; and a memory holding preloaded values, receiving a count value of the N-bit counter as an address and providing the periodic signals as an output.

13. The generator of claim 12 wherein the load register also receives a most significant bit of the N-bit register in the first mode and includes means for masking the means for detecting at every other detection in the second mode, if the most significant bit of the M-bit register was a one.

14. A generator of a periodic signal, comprising:

a clock having a clock period smaller than a predetermined period, the predetermined period being defined by a control signal;

means for counting a number of clock pulses that occur during the predetermined period, the number being defined in terms of a number of batches, a batch being a predetermined number of clock pulses;

means for detecting a batch of clock pulses;

means for counting batches that are detected by the means for detecting, the means for counting batches providing a batch count value as an output;

a memory, holding prestored values, the batch count value being received as an address and the memory providing the periodic signal as an output of the generator; and means for determining the number of batches and for programming the means for counting batches with the number of batches.

15. A method of generating a periodic signal, comprising the steps of:

generating clock pulses;

measuring a number of pulses A during a period defined by a control signal;

determining a whole number P, where P is equal to $A/2^N$;

counting a batch of P pulses of the clock;

counting a number of batches of P pulses of the clock which occur during the period and producing an address signal at each counting of a batch;

storing output binary signals at memory locations corresponding to the address signal;

accessing and retrieving the output binary signals from the memory by using the address signal; and outputting the output binary signals.

16. The method as recited in claim 15, further comprising the step of:

converting the output binary signal from a digital signal to an analog signal.

* * * * *

UNITED STATES PATENT AND TRADEMARK OFFICE
CERTIFICATE OF CORRECTION

PATENT NO. : 5,497,406

DATED : March 5, 1996

INVENTOR(S): Jader ALVES DE LIMA, Yong Uk LEE and Pierre NUNZI

It is certified that error appears in the above-identified patent and that said Letters Patent is hereby corrected as shown below:

On the title page, should read

[75] Inventors:     Jader Alves de Lima, Meylan; Yong-Uk Lee; Pierre J. Nunzi, both of Aix En Provence, all of France

[73] Assignee:     SGS-Thomson Microelectronics, S.A.
                           Saint Genis, Pouilly, France Signed and Sealed this Twenty-eighth Day of May, 1996

Attest:

BRUCE LEHMAN

*Attesting Officer*                 *Commissioner of Patents and Trademarks*